United States Patent
Ishikawa et al.

(10) Patent No.: US 6,468,639 B2
(45) Date of Patent: *Oct. 22, 2002

(54) SINGLE-APPLICATION POLYIMIDOSILOXANE-BASED COATING MATERIAL AND CURED FILM

(75) Inventors: Seiji Ishikawa; Shigeru Yamamoto; Yoshiaki Watanabe, all of Ichihara (JP)

(73) Assignee: Ube Industries, Ltd. (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/295,883

(22) Filed: Apr. 21, 1999

(65) Prior Publication Data
US 2002/0076548 A1 Jun. 20, 2002

(30) Foreign Application Priority Data
Apr. 28, 1998 (JP) .......................................... 10-118279

(51) Int. Cl.⁷ ........................... B32B 3/00; C08L 79/08; H01B 3/30
(52) U.S. Cl. ................... 428/209; 428/324; 428/330; 428/331; 428/447; 428/450; 428/473.5; 524/99; 524/104; 524/167; 524/173; 524/211; 524/233; 524/351; 524/352; 524/356; 524/367; 524/379; 524/386; 524/423; 524/493; 525/423; 525/476; 528/26; 528/28; 528/38

(58) Field of Search .................. 428/209, 473.5, 428/447, 450, 324, 330, 331, 323; 524/99, 104, 167, 173, 211, 351, 352, 356, 379, 386, 367, 233, 449, 423; 525/423, 476; 528/26, 28, 38

(56) References Cited

U.S. PATENT DOCUMENTS 5,643,986 A * 7/1997 Ishikawa et al. ............ 524/366

FOREIGN PATENT DOCUMENTS

| JP | 7304950 | 11/1995 |
|----|---------|---------|
| JP | 8253677 | 10/1996 |
| JP | 9118807 | 5/1997 |
| JP | 9118808 | 5/1997 |

* cited by examiner

Primary Examiner—D. S. Nakarani
(74) Attorney, Agent, or Firm—Morgan, Lewis & Bockius LLP

(57) ABSTRACT

A single-application polyimidosiloxane coating material comprising a uniformly mixed solution composition of a polyimidosiloxane with an epoxy resin-reactive group in the molecule, an epoxy resin and a fine inorganic filler in a solvent. The coating material has satisfactory storage stability and printing properties, and its cured films also have satisfactory properties and allow single-application printing.

5 Claims, 1 Drawing Sheet

SINGLE-APPLICATION POLYIMIDOSILOXANE-BASED COATING MATERIAL AND CURED FILM

BACKGROUND OF THE INVENTION

1. Field of the Invention

The present invention relates to a single-application polyimidosiloxane-based coating material containing an organic solvent-soluble polyimidosiloxane, an epoxy resin and a fine organic filler, and to a cured film obtained by heating the coating material.

The coating material of the invention has satisfactory storage stability and printing properties, gives cured films with satisfactory plating resistance (for example, tin resistance, tin burrowing resistance) and can be applied in a single application.

Also, the cured films of the invention have adhesion to substrates, flex resistance, heat resistance (for example, bump connection heat resistance and soldering heat resistance) and electrical properties, as well as plating resistance properties (for example, tin resistance and tin burrowing resistance), and can therefore be utilized as electrically insulating protective films.

Throughout the present specification, "single-application" will be used to mean a system wherein protection by a double-application coating material composed of two different insulating materials, one a plating resistant epoxy dam (Long periods are required for formation of epoxy dams.) employed to protect the wiring pattern of an IL (inner lead) and an OL (outer lead) of an electronic part subjected to TAB (tape automated bonding) or the like, and the other a polyimide-based coating material as a protective insulating film, is achieved with a coating material of a single type of insulating material.

Thus, according to the invention it is possible to eliminate one step with respect to conventional double-application coatings while achieving an equivalent or better function.

2. Description of the Related Art

Conventional uses of known aromatic polyimides, epoxy resins and so forth as electrical insulating protective films include such uses as insulating films for solid elements and insulating films for semiconductor integrated circuits, flexible wiring boards and the like.

Epoxy resins are used as epoxy dams because of their plating resistance and satisfactory adhesion with substrates, but they also require the use of curing agents, etc., which have presented various problems involving the storage stability of the curing agents and the operations-for two-part solution preparation, and when used as insulating films as mentioned above, the insulating films formed by thermosetting are rigid, have low plasticity and lack flex resistance.

Also, because aromatic polyimides are generally poorly soluble in organic solvents, a solution of an aromatic polyimide precursor (aromatic polyamic acid) must be used to form a coating film, subsequently accomplishing drying and imidation by heat treatment at high temperature over a long period to form an aromatic polyimide protective film, and this presents the problem that the electrical or electronic member itself, which is to be protected, undergoes heat deterioration.

On the other hand, aromatic polyimides which are soluble in organic solvents are known from, for example, Japanese Examined Patent Publication No. 57-41491 which describes an aromatic polyimide prepared by polymerizing and imidating a biphenyltetracarboxylic acid and a diamine compound in an organic polar solvent; however, since this polyimide does not have sufficient cohesion (adhesion) with silicon wafers, glass panels, flexible substrates and the like, it requires a process whereby the substrate is pretreated with an adhesion promoter.

SUMMARY OF THE INVENTION

It is an object of the present invention to provide a coating material which has storage stability and printing properties, the cured films of which possess the properties of plating resistance (tin resistance, tin burrowing resistance), heat resistance and plasticity, and which allow single-application coating, as well as cured films thereof.

In other words, the present invention provides a single-application polyimidosiloxane-based coating material which comprises (a) 100 parts by weight of an organic solvent-soluble polyimidosiloxane represented by general formulae (1) to (3)

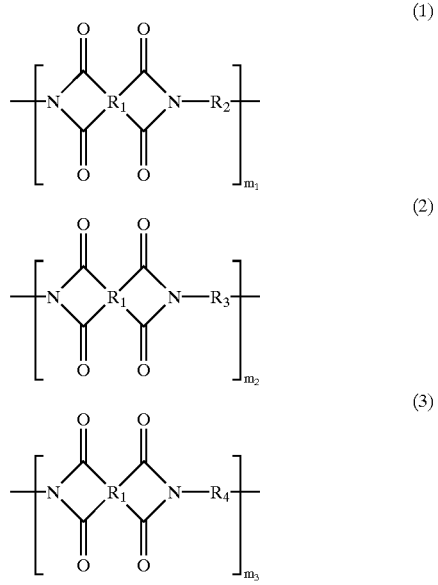

wherein $R_1$ is a tetravalent residue resulting from removal of the 4 carboxyl groups from an aromatic tetracarboxylic acid, $R_2$ is a divalent residue resulting from removal of the amino groups from a diaminopolysiloxane represented by general formula (4) below, $R_3$ is a divalent residue resulting from removal of the amino groups from an aromatic diamine compound represented by general formula (5) below, $R_4$ is a divalent residue resulting from removal of the amino groups from a diamine compound other than a diamine compound represented by general formulae (4) and (5) below, n, is 3–50, each $R_5$ is a divalent hydrocarbon group or phenyl group, each $R_6$ is independently an alkyl group of 1–3 carbon atoms or a phenyl group, X is a direct bond or a group selected from the groups represented by general formulae (6) below, r, is a hydroxyl group or carboxyl group, $n_2$ is an integer of 1 or 2, $n_3$ is an integer of 0–3, $R_7$ and $R_8$ are hydrogen, methyl groups or trifluoromethyl groups, and $m_1$, $m_2$ and $m_3$ are in a proportion such that of the total 100 mole percent of the components, $m_1$ constitutes 60–92.5 mole percent, $m_2$ constitutes 7.5–40 mole percent and $m_3$ constitutes the remainder;

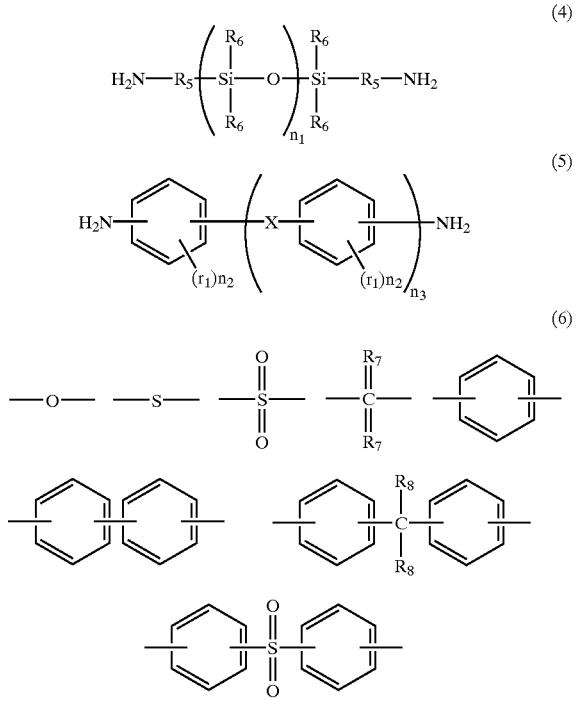

(b) 2–30 parts by weight of an epoxy resin;
(c) 20–150 parts by weight of a fine inorganic filler; and
(d) 60–140 parts by weight of a high-boiling-point solvent, and which has a viscosity of 400–1000 poise.

The invention further provides a cured film prepared by coating, heating and drying a single-application polyimidosiloxane-based coating material comprising the components listed above on the pattern surface of an electronic part having an insulating film and a conductor-formed pattern thereon.

The invention still further provides a single-application polyimidosiloxane coating material which is obtained by uniform mixing of a polyimidosiloxane including an epoxy resin-reactive functional group, an epoxy resin and a fine inorganic filler in a high-boiling-point solvent, which is printable, and which upon heating and drying gives a cured film with an elastic modulus of 0.1–20 kg/mm² and tin burrowing of 100 µm or less.

The invention still further provides a cured film prepared by coating, heating and drying a printable single-application polyimidosiloxane coating material, which is obtained by uniform mixing of a polyimidosiloxane obtained using an aromatic diamine including an epoxy resin-reactive functional group, an epoxy resin and a fine inorganic filler in a high-boiling-point solvent, on the pattern surface of an electronic part having an insulating film and a conductor-formed pattern thereon, the cured film having an elastic modulus of 0.1–20 kg/mm², and tin burrowing of 100 µm or less, and preferably 10–100 µm

BRIEF DESCRIPTION OF THE DRAWINGS

In FIGS. 1 and 2, 1 denotes an insulating film, 2 a tin-plated conductor-formed pattern, 3 a single-application polyimidosiloxane-based cured film, 30 a double-application coating material, 4 an IC tip, 5 a bump, 6 a bend portion-protecting resin, 7 a sealing compound, 8 an epoxy dom, and 9 an outer lead.

DESCRIPTION OF THE PREFERRED EMBODIMENTS

Figure 1:
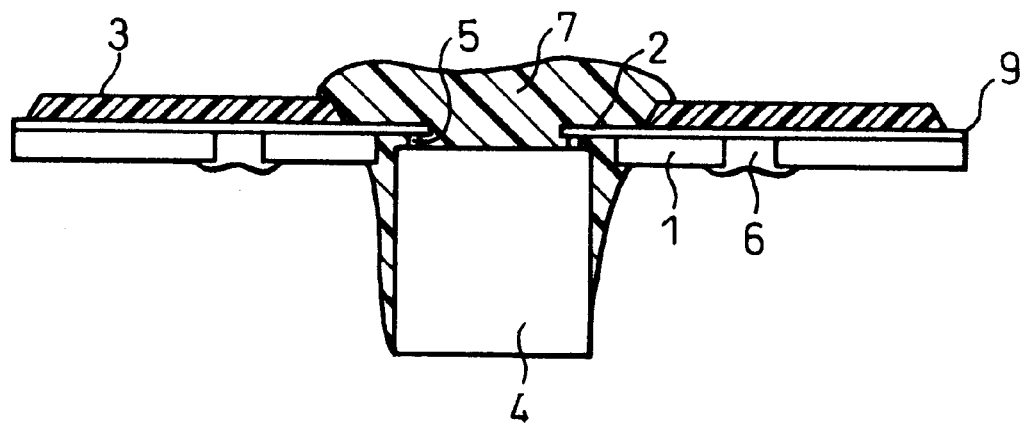
FIG. 1 is a sketch showing an embodiment comprising an insulating film and a single-application polyimidosiloxane-based cured film according to the invention which has been formed on the conductor-formed pattern side thereof.
Figure 2:
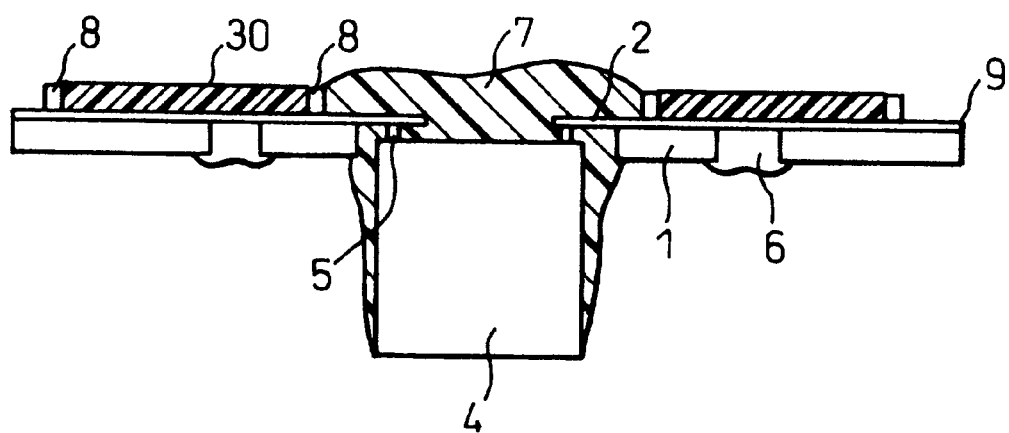
FIG. 2 is a sketch showing an example according to the prior art.

The polyimidosiloxane of the invention can by obtained from an aromatic tetracarboxylic dianhydride or its derivative (ester, etc.), a diaminopolysiloxane represented by general formula (4) above and a diamine compound represented by general formula (5) above, by heat imidation or chemical imidation in an organic solvent.

As aromatic tetracarboxylic acids according to the invention there may be mentioned 2,3,3',4'-biphenyltetracarboxylic acid, 3,3',4,4'-biphenyltetracarboxylic acid, 3,3',4,4'-diphenylether tetracarboxylic acid, 3,3',4,4'-diphenylsulfonetetracarboxylic acid, 3,3',4,4'-benzophenonetetracarboxylic acid, 2,2-bis(3,4-benzenedicarboxylic acid) hexafluoropropane, pyromellitic acid, 1,4-bis(3,4-benzenedicarboxylic acid) benzene, 2,2-bis [4-(3,4-phenoxydicarboxylic acid) phenyl]propane, and their anhydrides and lower alcohol ester compounds.

Among these there are particularly preferred 2,3,3',4'-biphenyltetracarboxylic dianhydride and 3,3',4,4'-diphenylether tetracarboxylic diandride, because of their excellent solubility in organic solvents such as polyimidosiloxane mentioned above.

As a diaminopolysiloxane represented by general formula (4) according to the invention there may be mentioned those wherein $R_5$ in the formula represents a divalent hydrocarbon group and comprises methylene or phenylene groups of 2–6 and preferably 3–5 carbon atoms, each $R_6$ is independently a methyl, ethyl, propyl or other alkyl group of 1–3 carbon atoms or a phenyl group, and n, represents 3–50 and preferably 3–20.

The range for $n_1$ is specified as such because if the value of $n_1$ above is too low the curling will tend to be too great, and if the value of $n_1$ is very large the solvent resistance may be lower, the reactivity with the aromatic tetracarboxylic acid component may be lowered, the molecular weight of the resulting polyimidosiloxane may be reduced, the solubility in organic solvents may be lower, and it may have poorer compatibility with other organic compounds.

As specific compounds for the aforementioned diaminopolysiloxane there may be mentioned α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3-methylphenyl)polydimethylsiloxane, α,ω-bis(3-aminopropyl)polydiphenylsiloxane and α,ω-bis(4-aminobutyl)polydimethylsiloxane.

The diamine compound represented by general formula (5) above is an aromatic diamine with an epoxy resin-reactive group in the molecule.

As diamine compounds represented by general formula (5) according to the invention there may be mentioned diamine compounds with OH groups, including diaminophenol compounds such as 2,4-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl and 4,4'-diamino-2,2', 5,5'-tetrahydroxybiphenyl; hydroxydiphenylalkane compounds such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane and 4,4'diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether and 4,4'-diamino-2,2',5,5'-tetrahydroxydiphenyl ether; hydroxydiphenylsulfone compounds such as 3,3'-diamino-4,4'-dihydroxydiphenylsulfone, 4,4'-diamino-3,3'-dihydroxydiphenylsulfone, 4,4'-diamino-2,2'-dihydroxydiphenylsulfone and 4,4'-diamino-2,2',5,5'-tetrahydroxydiphenylsulfone;

bis(hydroxyphenoxyphenyl)alkane compounds such as 2,2-bis[4-(4-amino-3-hydroxyphenoxy)phenyl]propane; bis(hydroxyphenoxy)biphenyl compounds such as 4,4'-bis(4-amino-3-hydroxyphenoxy)biphenyl; and bis(hydroxyphenoxyphenyl)sulfone compounds such as 2,2-bis[4-(4-amino-3-hydroxyphenoxy)phenyl]sulfone.

As additional diamine compounds represented by general formula (5) there may be mentioned diamine compounds with COOH groups including benzenecarboxylic acids such as 3,5-diaminobenzoic acid and 2,4-diaminobenzoic acid; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl and 4,4'-diamino-2,2',5,5'-tetracarboxybiphenyl; carboxydiphenylalkane compounds such as 3,3'-diamino-4,4'-dicarboxydiphenylmethane, 4,4'-diamino-4,4'-dicarboxydiphenylmethane, 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis [ 3-amino-4-carboxyphenyl]hexafluoropropane and 4,4'-diamino-2,2',5,5'-tetracarboxybiphenl; carboxydiphenyl ether compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether and 4,4'-diamino-2,2',5,5'-tetracarboxydiphenyl ether;

carboxydiphenylsulfone compounds such as 3,3'-diamino-4,4'-dicarboxydiphenylsulfone, 4,4'-diamino-3,3'-dicarboxydiphenylsulfone and 4,4'-diamino-2,2',5,5'-tetracarboxydiphenylsulfone;

bis(carboxyphenoxyphenyl)alkane compounds such as 2,2-bis[4-(4-amino-3-carboxyphenoxy)phenyl]propane; bis(carboxyphenoxy)biphenyl compounds such as 4,4'-bis(4-amino-3-carboxyphenoxy)biphenyl; and bis(carboxyphenoxyphenyl)sulfone compounds such as 2,2-bis[4-(4-amino-3-carboxyphenoxy)phenyl]sulfone.

According to the invention $R_4$ in general formula (3) is a divalent residue resulting from removal of the amino groups from a diamine compound ($H_2N$—$R_4$—$NH_2$) other than a diamine compound represented by general formulae (4) and (5).

As these diamine compounds ($H_2N$—$R_4$—$NH_2$) there may be mentioned diamine compounds including diamines containing one benzene, such as 1,4-diaminobenzene, 1,3-diaminobenzene, 2,4-diaminotoluene and 1,4-diamino-2,5-dihalogenobenzene; diamines containing two benzenes, such as bis(4-aminophenyl) ether, bis(3-aminophenyl) ether, bis(4-aminophenyl) sulfone, bis(3-aminophenyl) sulfone, bis(4-aminophenyl)methane, bis(3-aminophenyl)methane, bis(4-aminophenyl) sulfide, bis(3-aminophenyl) sulfide, 2,2-bis(4-aminophenyl)propane, 2,2-bis(3-aminophenyl) propane, 2,2-bis(4-aminophenyl)hexafluoropropane, o-dianisidine, o-tolidine and tolidinesulfonic acids; diamines including three benzenes, such as 1,4-bis(4-aminophenoxy)benzene, 1,4-bis(3-aminophenoxy)benzene, 1,4-bis(4-aminophenyl)benzene, 1,4-bis(3-aminophenyl) benzene, α,α'-bis(4-aminophenyl)-1,4-diisopropylbenzene and α,α'-bis(4-aminophenyl)-1,3-diisopropylbenzene; and diamines containing 4 or more benzenes, such as 2,2-bis[4-(4-aminophenoxy)phenyl]propane, 2,2-bis[4-(4-aminophenoxy)phenyl]hexafluoropropane, 2,2-bis[4-(4-aminophenoxy)phenyl] sulfone, 4,4'-(4-aminophenoxy) biphenyl, 9,9-bis(4-aminophenyl)fluorene and 5,10-bis(4-aminophenyl)anthracene.

Hexamethylenediamine, diaminododecane and other aliphatic diamine compounds may also be used together with the aforementioned diamines.

According to the invention the proportions of the units of general formula (1), general formula (2) and general formula (3) in the polyimidosiloxane components are, respectively, 60–95 mole percent (preferably 60–92.5 mole percent), 5–40 mole percent (preferably 7.5–40 mole percent) and the remainder, and preferably 60–90 mole percent, 5–30 mole percent and the remainder (normally 0–30 mole percent). If any of the components are present in too large or too small an amount outside of these ranges, the resulting polyimidosiloxane will have reduced solubility in organic solvents, its compatibility with other organic compounds will be poorer, the radius of curvature of a protective film formed on a wiring substrate will be smaller thus lowering the flex resistance, and the adhesion and heat resistance will be reduced rendering it unsuitable.

The polyimidosiloxane of the invention can be obtained by one of the following processes.

(1) A process for obtaining polyimidosiloxanes whereby an aromatic tetracarboxylic acid component and a diaminopolysiloxane and aromatic diamine as diamine components are used in roughly equimolar amounts for continuous polymerization and imidation at 15–250° C. in an organic polar solvent.

(2) A process for obtaining block-type polyimidosiloxanes whereby the diamine components are separated, the diaminopolysiloxane is first polymerized and imidated with an excess of the aromatic tetracarboxylic acid component in an organic polar solvent at 15–250° C. to prepare an imidosiloxane oligomer with an average polymerization degree of about 1–10 having acid or acid anhydride groups at the ends, an excess of the aromatic diamine is separately polymerized and imidated with the aromatic tetracarboxylic acid component in an organic polar solvent at 15–250° C. to prepare an imide oligomer with an average polymerization degree of about 1–10 having amino groups at the ends, and then both of these are mixed at roughly equivalent molar amounts of the acid components and diamine components, reacted at 15–60° and further heated at 130–250° C.

(3) A process for obtaining polyimidosiloxanes whereby an aromatic tetracarboxylic acid component and a diaminopolysiloxane and aromatic diamine as diamine components are used in roughly equimolar amounts for polymerization at 20–80° C. in an organic polar solvent to first obtain a polyamic acid, followed by imidation.

As organic polar solvents used to obtain the polyimidosiloxane there may be mentioned nitrogen-based solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, N-methylcaprolactam, etc.; sulfur atom-containing solvents such as dimethylsulfoxide, diethylsulfoxide, dimethylsulfone, diethylsulfone, hexamethylsulfamide, etc.; phenolic solvents such as cresol, phenol, xylenol, etc.; diglyme-based solvents such as diethyleneglycol dimethyl ether (diglyme), triethyleneglycol dimethyl ether (triglyme), tetraqlyme, etc.; solvents containing oxygen atoms in the molecule, such as acetone, methanol, ethanol, ethylene glycol, dioxane, tetrahydrofuran, etc.; as well as pyridine, tetramethylurea and the like.

If necessary, other organic solvents may be used in combination therewith, including aromatic hydrocarbon-based solvents such as toluene and xylene, and solvent naphtha, benzonitrile and the like.

According to the invention, the polyimidosiloxane may be one obtained by any of the processes described above under (1) to (3), and it preferably is of as high molecular weight as possible, with a high imidation rate, soluble in high-boiling-point solvents to a high concentration of at least 3 wt %, preferably 5–60 wt % and especially about 5–50%, and having a 25° C. solution viscosity (E-type rotational viscometer) of 1–10,000 poise, and particularly 1–100 poise.

The imidation rate of the polyimidosiloxane is preferably at least 90%, and especially at least 95%, and compounds with an inherent viscosity (measuring concentration: 0.5 g/100 milliliters, solvent: N-methyl-2-pyrrolidone, measuring temperature: 30° C.) of at least 0.15 and especially 0.16–2 as a standard of the molecular weight, are preferred from the standpoint of mechanical properties including the cured product strength and ductility.

The epoxy resin (hereunder referred to simply as "epoxy") used according to the invention is preferably a liquid or solid epoxy resin with about 100–1000 epoxy equivalents and a molecular weight of about 300–5000. As examples there may be mentioned bisphenol A-type and bisphenol F-type epoxy resins (Yuka Shell: Epikote 806, Epikote 825, etc.) and epoxy resins with 3 or more functional groups (Yuka Shell: Epikote 152, Epikote 154, Epikote 180 series, Epikote 157 series, Epikote 1032 series, and Ciba-Geigy: MT0163).

The amount of the epoxy resin to be used according to the invention is 1–30 parts by weight, preferably 2–30 parts by weight, and more preferably 3–25 parts by weight to 100 parts by weight of the polyimidosiloxane. This range is preferred because if it is used in too large an amount or too small an amount, the adhesion may be reduced and the post-curing heat resistance and chemical resistance may be impaired.

The epoxy resin may also be used with added components which promote curing of epoxy resins, such as hydrazides, imidazoles and the like.

According to the invention it is necessary to use at least one type of fine inorganic filler such as Aerosil, talc, mica or barium sulfate, and while the fine inorganic filler may be of any size and shape, it is preferred to have a mean particle size of 0.001–15 µm, and especially 0.005–10 µm. Using fillers outside of this range is not preferred because the resulting coated film will produce cracks upon bending and will become whitened at folded sections.

According to the invention it is particularly preferred to use a combination of Aerosil (fine powdered silica) with one or more of talc, mica and barium sulfate.

The amount of the fine inorganic filler to be used according to the invention is 20–150 parts by weight, and preferably 40–125 parts by weight as a total to 100 parts by weight of the polyimidesiloxane. This range is necessary because if it is used in too great or too small an amount, cracks will occur in the coated film upon folding, and the soldering heat resistance and copper foil coloration will be poorer.

When using a combination of Aerosil with one or more of talc, mica and barium sulfate, it is preferred to use the Aerosil at 1–50 parts by weight, particularly 5–40 parts by weight to 100 parts by weight of the polyimidosiloxane, and one or more of talc, mica and barium sulfate at 20–130 parts by weight to 100 parts by weight of the polyimidosiloxane.

The polyimidosiloxane solution composition used for the single-application coating material of the invention can be easily obtained by uniformly stirring and mixing prescribed amounts of the polyimidosiloxane, epoxy resin and fine inorganic filler. The mixing may be accomplished in a boiling-point solvent to make a polyimidosiloxane solution composition. When preparing a solution composition by mixture with a solvent, the polyimidosiloxane polymerization solution may be used directly, or the polymerization solution may be further diluted with an appropriate organic solvent. The high-boiling-point solvent may be an organic polar solvent of the same type used to obtain the polyimidosiloxane, but one with a boiling point of from 140° C. to 210° C. is preferably used. Organic solvents with boiling points of 180° C. or higher and particularly 200° C. or higher (for example, methyl triglyme, etc.) are ideal for use since they have very low dissipation of the solvent due to evaporation because printing inks employing them are suitable for problem-free screen printing and other types of printing.

The amount of the organic solvent to be used according to the invention may preferably be 60–140 parts by weight per 100 parts by weight of the polyimidosiloxane.

Polyimidosiloxane solution compositions with a solution viscosity of 400–1000 poise, and particularly 500–1000 poise, are preferred from the standpoint of handle ability, solution properties and their protective film properties. To the polyimidosiloxane composition, other additives may be added.

Because the single-application coating material according to the invention consists of the composition described above and has viscosity, it is preferably printed and coated onto the pattern side of an electronic part with an insulating film and a conductor-formed pattern thereon to a dry film thickness of about 10–60 µm by screen printing or the like, and then heated and dried at a temperature of about 50–120° C. for about 5–60 minutes and then at a temperature of about 120–180° C. for about 5–120 minutes, to form an insulating film with an elastic modulus of 0.1–20 kg/mm$^2$.

This insulating film has good adhesion with substrates (patterns, polyimide insulating films, etc.), flex resistance, heat resistance and electrical properties as well as acceptable plating resistance: tin burrowing of 100 µm or less and particularly 10–100 µm, and solvent resistance (for example, to acetone or isopropanol), and it therefore functions as a protective film without provision of a satisfactorily plating-resistant epoxy dam.

After forming the insulating film from the coating material, it is normally tin plated, bumps are formed, IC connections are made, and sealing is accomplished with an epoxy-based sealant.

The present invention will now be further explained by way of examples and comparative examples. The measurements and evaluations in these examples were made by the following methods.

The compounds used in the examples which follow are indicated by the following abbreviations.

a-BPDA: 2,3,3',4'-biphenyltetracarboxylic dianhydride
s-BPDA: 3,3,4',4'-biphenyltetracarboxylic dianhydride
DAPSi: α,ω-bis(3-aminopropyl)polydimethylsiloxane
DABA: 3,5-diaminobenzoic acid
MBAA: bis(3-carboxy-4-aminophenyl)methane
BAPP: 2,2-bis[4-(4-aminophenoxy)phenyl]propane
TG: triglyme The evaluation of the properties in the examples were carried out in the following manner. Viscosity: Measured using an E-type viscometer (Tokyo Instruments), 25° C., ST rotor. Printing property: "o" indicates screen printable samples with no pinholes in the formed films and no flow out at the tips, and "x" indicates samples which either could not be screen printed, had pinholes in the films, or had flow out at the tips. Warping: The curvature radius was measured in the following manner.

According to JIS C-6481, forming a 35 $\mu$m thick insulating film on Upilex-75S (product of Ube Industries, Ltd.). Elastic modulus, tensile modulus, ductility: Measured according to ASTM D882.
Tin burrowing: A non-electrolytic tin plating solution (LT-34, product of Cipray Far East Co.) was used for tin plating at a temperature of 70° C. for 4 minutes, and the distance the tin penetrated was measured as the basis for evaluation. A distance of 100 $\mu$m or less was evaluated as satisfactory.
Surface resistivity: Measured according to JIS C-2103.
Volume resistivity: Measured according to JIS C-2103.
Solvent resistance: After dipping for 30 minutes in acetone (25° C.), an acetone soluble portion of less than 2% was evaluated as "o", and 2% or greater as "x". Heat resistance: The decomposition temperature of the coated film was measured by TGA.
Adhesion: Samples which had no swelling or peeling upon visual examination were evaluated as good, and those with swelling or peeling were evaluated as poor.

o: good x: poor

PRODUCTION OF POLYIMIDOSILOXANE

Reference Example 1

In a 500-ml volume glass flask there were charged 45.2 g (153.8 millimoles) of a-BPDA and 100 g of methyltriglyme (TG), and the mixture was heated and stirred at 180° C. under a nitrogen atmosphere. After adding 117.3 g (127.5 millimoles) of α,ω-bis(3-aminopropyl) polydimethylsiloxane (460 amino equivalents, $n_1$=0) and 40 g of TG, the mixture was heated and stirred at 180° C. for 60 minutes. To this reaction solution there were further added 6.4 g (22.5 millimoles) of MBAA and 20 g of TG, and after heating and stirring the mixture at 180° C. for 10 hours, it was filtered. The resulting polyimidosiloxane reaction solution had a polymer solid concentration of 51 wt %, ηinh of 0.18 and a solution viscosity of 25 poise. The imidation rate was essentially 100%.

Reference Examples 2–8

The polyimidosiloxane reaction solutions listed in Table 1 were obtained in the same manner as Reference Example 1, except that the acid dianhydrides and diamine components listed in Table 1 were used.

Example 1

In a glass vessel there were charged 6 g of an epoxy resin (Epikote 157S70, product of Yuka Shell Co.), 1 g of phthalocyanine green as a pigment, 0.18 g of 2-ethyl-4-methylimidazole as a catalyst, and 0.06 g of phthalic anhydride, with 9.0 g of Aerosil (mean particle size: 0.01 $\mu$m), 22.4 g of barium sulfate (mean particle size: 0.3 $\mu$m), 5.6 g of talc (mean particle size: 1.8 $\mu$m), 5.6 g of mica (mean particle size: 2.6 $\mu$m) and 2.8 g of a silicon-based anti-foaming agent, into 100 g of the solution prepared by adding TG to a polyimidosiloxane solution to a polymer solid concentration of 50 wt % which was obtained in Reference Example 1, and the mixture was stirred for 2 hours at room temperature (25° C.) to obtain a uniformly mixed polyimidosiloxane solution composition (solution viscosity: 600 poise).

The solution composition exhibited little change in viscosity even after standing for 30 minutes in a refrigerator at approximately 5° C., and it was therefore suitable for screen printing.

Table 3 shows the results of evaluating the solution composition and its cured film.

The polyimidosiloxane solution composition was also screen printed onto the pattern side of a carrier tape with a pattern formed by an electrolytic copper foil (Rz: approx. 2 $\mu$m, thickness: 35 $\mu$m) laminated on a 75-$\mu$m thick polyimide film [Ube Industries, Ltd.: Upilex 75S, linear expansion coefficient (50–200° C.): $2.0 \times 10^{-5}$ cm/cm/° C.] via a heat resistant adhesive, and this was heated and dried at 80° C. for 30 minutes and at 160° C. for 60 minutes to form a 20-$\mu$m thick insulating film (cured film).

There was no warping in the resulting laminate of the cured film on the pattern film, and the cured film strongly adhered to the pattern film.

Examples 2–8

Uniform polyimidosiloxane solution compositions were prepared in the same manner as Example 1, except that the types and amounts listed in Table 2 were used.

These solution compositions exhibited storage stability similar to Example 1.

Table 3 shows the results of evaluating the solution compositions and their cured films.

Also, laminates obtained by screen printing and drying these solution compositions on the pattern sides of carrier tapes had no warping and strong adhesion between the cured films and pattern films.

The insulating films (cured films) of Examples 1–8 had tensile strengths of 0.8–1.0 kg/mm² and ductility values of 30–60%, thus exhibiting satisfactory strength and ductility.

Comparative Examples 1–3

Solution compositions were prepared in the same manner as Example 1 except that the combinations were varied as listed in Table 1.

Table 3 shows the results of evaluating the solution compositions and their cured films.

All of the solution compositions were unsuitable as ingle-application coating materials.

TABLE 1

| Ref. Exs. | Polyimidosiloxane monomer composition (molar ratio) | | | | | |
|---|---|---|---|---|---|---|
| | Acid components | | Diamine components | | | |
| | a-BPDA mol % | s-BPDA mol % | DAPSi mol % | BAPP mol % | MBAA mol % | DABA mol % |
| 1 | 100 | 0 | 85 | 0 | 15 | 0 |
| 2 | 100 | 0 | 90 | 0 | 10 | 0 |
| 3 | 100 | 0 | 80 | 0 | 20 | 0 |
| 4 | 100 | 0 | 70 | 15 | 15 | 0 |
| 5 | 100 | 0 | 85 | 0 | 0 | 15 |
| 6 | 95 | 5 | 85 | 0 | 15 | 0 |
| 7 | 100 | 0 | 50 | 35 | 0 | 15 |

TABLE 2

| | Polyimidosiloxane-based coating material composition (wt. ratio) | | | | |
|---|---|---|---|---|---|
| | PISi | | | Inorganic filler | Solvent |
| Ref. Ex. | Amt. | Epoxy resin | | Aerosil/ BaSO₄/Talc/Mica | TG amt. |
| | | Type | Amt. | | |
| Exs. | | | | | |
| 1 | 1 | 100 | 157S70 | 12 | 18/40/10/10 | 100 |
| 2 | 1 | 100 | 157S70 | 18 | 18/60/20/0 | 100 |
| 3 | 1 | 100 | 157S70 | 6 | 18/60/20/0 | 100 |
| 4 | 2 | 100 | 157S70 | 12 | 18/60/20/0 | 100 |
| 5 | 3 | 100 | 157S70 | 12 | 18/40/10/10 | 100 |
| 6 | 5 | 100 | 157S70 | 12 | 18/40/10/10 | 100 |
| 7 | 6 | 100 | 157S70 | 12 | 18/40/10/10 | 100 |
| 8 | 1 | 100 | 1002 | 12 | 18/40/10/10 | 100 |
| Comp. Exs. | | | | | |
| 1 | 1 | 100 | 157S70 | 12 | 18/0/10/10 | 100 |
| 2 | 7 | 100 | 157S70 | 12 | 18/40/20/0 | 100 |
| 3 | 1 | 100 | 157S70 | 0 | 18/40/10/10 | 100 |

PISi: polyimidosiloxane

The single-application polyimidosiloxane-based coating materials and cured films of the present invention having the construction described above thus exhibit the following effects.

The single-application polyimidosiloxane-based coating materials of the invention have satisfactory storage stability, with no generation of pinholes in the films formed by coating them, as well as low tip flow out and excellent printing properties.

The cured films according to the invention have excellent electrical properties, heat resistance, flex resistance, warping resistance, adhesion and plating resistance, and therefore do not require epoxy resin-based dam printing as has been necessary according to the prior art, thus providing cost reductions for TAB and the like employed for liquid crystal drivers. In addition, because epoxy resin printing is not required, it is possible to accomplish TAB products in the small sizes necessary for the narrow borders of LCDs.

What is claimed is:

1. A single application polyimidosiloxane-based coating material which comprises:

(a) 100 parts by weight of an organic solvent-soluble polyimidosiloxane represented by general formulae (1) to (3)

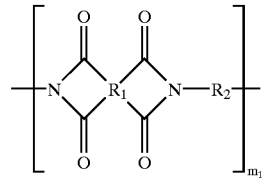

(1)

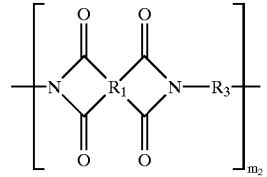

(2)

TABLE 3

| | Coating material and cured film properties | | | | | | | | |
|---|---|---|---|---|---|---|---|---|---|
| | Viscosity (P.) | Printing property | Warping (mm) | Elastic modulus (kg/mm²) | Tin burrowing (μm) | Adhesion | Solvent resistance | Surface resistivity (Ω) | Volume resistivity Ω-cm |
| Exs | | | | | | | | | |
| 1 | 600 | ○ | >300 | 8 | 70 | ○ | ○ | >1.0 × 10¹⁶ | >1.5 × 10¹⁵ |
| 2 | 600 | ○ | >300 | 10 | 75 | ○ | ○ | >1.0 × 10¹⁶ | >1.5 × 10¹⁵ |
| 3 | 600 | ○ | >300 | 5 | 70 | ○ | ○ | >1.0 × 10¹⁶ | >1.5 × 10¹⁵ |
| 4 | 650 | ○ | >300 | 4 | 70 | ○ | ○ | >1.0 × 10¹⁶ | >1.5 × 10¹⁵ |
| 5 | 600 | ○ | 250 | 12 | 80 | ○ | ○ | >1.0 × 10¹⁶ | >1.5 × 10¹⁵ |
| 6 | 650 | ○ | >300 | 10 | 90 | ○ | ○ | >1.0 × 10¹⁶ | >1.5 × 10¹⁵ |
| 7 | 660 | ○ | >300 | 8 | 90 | ○ | ○ | >1.0 × 10¹⁶ | >1.5 × 10¹⁵ |
| 8 | 700 | ○ | >300 | 8 | 90 | ○ | ○ | >1.0 × 10¹⁶ | >1.5 × 10¹⁵ |
| Comp. Exs. | | | | | | | | | |
| 1 | 300 | ○ | >300 | 5 | 250 | ○ | ○ | — | — |
| 2 | 700 | ○ | 15 | 50 | 80 | ○ | ○ | — | — |
| 3 | 600 | ○ | 250 | 4 | 80 | ○ | x | — | — |

P.: poise

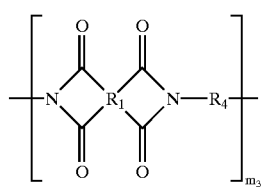

(3)

wherein $R_1$ is a tetravalent residue resulting from removal of the 4 carboxyl groups from an aromatic tetracarboxylic acid, $R_2$ is a divalent residue resulting from removal of the amino groups from a diaminopolysiloxane represented by general formula (4) below, $R_3$ is a divalent residue resulting from removal of the amino groups from an aromatic diamine compound represented by general formula (5) below, $R_4$ is a divalent residue resulting from removal of the amino groups from a diamine compound selected from the group consisting of 1,4-diaminobenzene, 1,3-diaminobenzene, 2,4-diaminotoluene, 1,4-diamino-2,5-dihalogenobenzene, bis(4-aminophenyl)ether, bis(3-aminophenyl)ether, bis(4-aminophenyl)sulfone, bis(3-aminophenyl)sulfone, bis(4-aminophenyl)methane, bis(3-aminophenyl)methane, bis(4-aminophenyl sulfide, bis(3-aminophenyl)sulfide, 2,2-bis(4-aminophenyl) propane, 2,2-bis(3-aminophenyl)propane, 2,2-bis(4-aminophenyl)hexafluoropropane, o-dianisidine, o-tolidine, tolidinesulfonic acids, 1,4-bis(4-aminohenoxy)benzene, 1,4-bis(3-amninophenoxy) benzene, 1,4-bis(4-aminophenyl)benzene, 1,4-bis(3-aminohenyl)benzene, αα'-bis(4-aminophenyl)-1,4-diisopropylbenzene, α,α'-bis(4-aminophenyl)-1,3-diisopropylbenzene, 2,2-bis[4-(4-aminophenoxy) phenyl]propane, 2,2-bis[4-(4-aminophenoxy)phenyl] hexafluoropropane, 2,2-bis[4(4-aminophenoxy) phenyl]sulfone, 4, 4'-(4-aminophenoxy)biphenyl, 9,9-bis) (4-aminophenyl)fluorene and 5,10-bis(4-aminophenyl)anthracene, and the combinations thereof with hexamethylenediamine and diaminododecane, wherein $n_1$ is 3–50, each $R_5$ is a divalent hydrocarbon group or phenyl group, each $R_6$ is independently an alkyl group of 1–3 carbon atoms or a phenyl group, X is a direct bond or a member selected from the groups represented by general formulae (6)below, $r_1$ is a carboxyl group, $n_2$ is an integer of 1 or 2, $n_3$ is an integer of 0–3, $R_7$ and $R_8$ are hydrogemethyl groups or trifluoromethyl groups, and $m_1$, $m_2$ and $m_3$ are in a proportion such that of the total 100 mole percent of the components, $m_1$ constitutes 60–92.5 mole percent, $m_2$ constitutes 7.5–40 mole percent and $m_3$ constitutes the remainder;

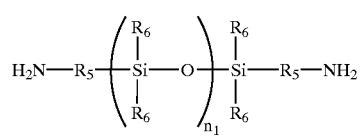

(4)

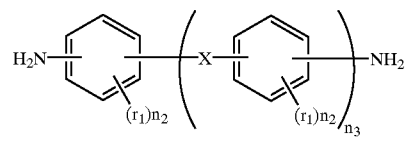

(5)

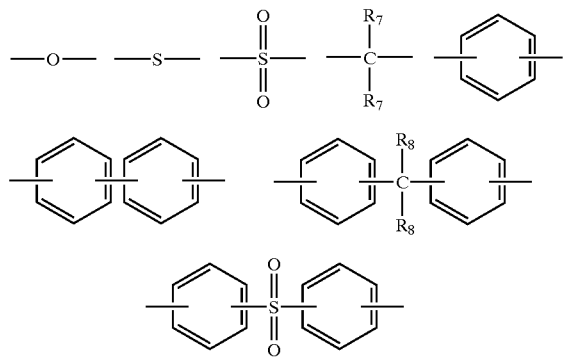

(6)

(b) 2–30 parts by weight of an epoxy resin;
(c) 40–125 parts by weight of a fine inorganic filler having a mean particle size of 0.001 to 15 μm; and
(d) 60–140 parts by weight of a high-boiling-point solvent, having a boiling point of 140 to 210° C., which has a viscosity of 400–1000 poise and which gives a cured film with tin burrowing of 100 μm or less upon heating and drying.

2. A coating material ascending to claim 1, wherein the fine inorganic filler is finely divided anhydrous silica, talc, mica or barium sulfate.

3. A cured film prepared by coating and then heating and drying a single-application polyimidosiloxane coating material according to claim 1 on a pattern surface of an electronic part having an insulating film and a conductor-formed pattern thereon.

4. A cured film according to claim 3 having an elastic modulus of 0.1–20 kg/mm$^2$.

5. A cured film according to claim 3, wherein the insulating film is a polyimide film with a linear expansion coefficient (50–200° C.) of $10 \times 10^{-6}$ to $20 \times 10^{-6}$ cm/cm/° C.

* * * * *